United States Patent [19]
Young

[11] 4,430,519
[45] Feb. 7, 1984

[54] ELECTRON BEAM WELDED PHOTOVOLTAIC CELL INTERCONNECTIONS

[75] Inventor: Walter M. Young, Largo, Fla.

[73] Assignee: AMP Incorporated, Harrisburg, Pa.

[21] Appl. No.: 383,061

[22] Filed: May 28, 1982

[51] Int. Cl.³ ................. H01L 31/18; H01L 31/04
[52] U.S. Cl. ................. 136/244; 29/572; 29/589; 29/591; 219/121 EC; 219/121 ED
[58] Field of Search ......... 136/244; 29/572, 589, 29/591; 219/121 EC, 121 ED

[56] References Cited

U.S. PATENT DOCUMENTS

| | | | |
|---|---|---|---|
| 3,094,439 | 6/1963 | Mann et al. | 136/244 |
| 3,330,700 | 7/1967 | Golub et al. | 136/244 |
| 3,378,407 | 4/1968 | Keys | 136/244 |
| 3,446,676 | 5/1969 | Webb et al. | 136/244 |
| 3,502,507 | 3/1970 | Mann | 136/244 |
| 3,575,721 | 4/1971 | Mann | 136/244 |
| 3,620,847 | 11/1971 | Wise | 136/244 |
| 3,973,996 | 8/1976 | Kennedy | 136/206 |
| 4,019,924 | 4/1977 | Kurth | 136/244 |
| 4,296,270 | 10/1981 | Köhler | 136/244 |
| 4,321,416 | 3/1982 | Tennant | 136/244 |
| 4,336,648 | 6/1982 | Pschunder et al. | 29/572 |
| 4,340,803 | 7/1982 | Coyle | 219/56.22 |
| 4,350,836 | 9/1982 | Crouthamel et al. | 136/244 |

OTHER PUBLICATIONS

E. J. Stofel et al., "Welded Solar Cell Interconnection", *Conf. Record, 16th IEEE Photovoltaic Specialists Conf.* (1982), pp. 45-50.

L. G. Chidester et al., "Advances In Solar Cell Welding Technology", *Conf. Record, 16th IEEE Photovoltaic Specialists Conf.* (1982) pp. 51-56.

W. Luft, "Solar Cell Interconnector Design", *IEEE Trans. Aerospace/Electronic Systems*, vol. AES-7, pp. 781-791 (1971).

*Primary Examiner*—Aaron Weisstuch
*Attorney, Agent, or Firm*—F. Brice Faller

[57] ABSTRACT

Interconnect strip for connecting rectangular photovoltaic cells into series strings comprises tabs spaced as collector pads on a cell to facilitate connection thereto and a bus portion for connection to the opposite side of an adjacent cell. The strip is laminated on both sides with dielectric to prevent short circuiting between opposite sides of the same cell when cell spacing is extremely close. Apparatus and method for automated manufacture of cell arrays employing laminated interconnect are also disclosed.

2 Claims, 15 Drawing Figures

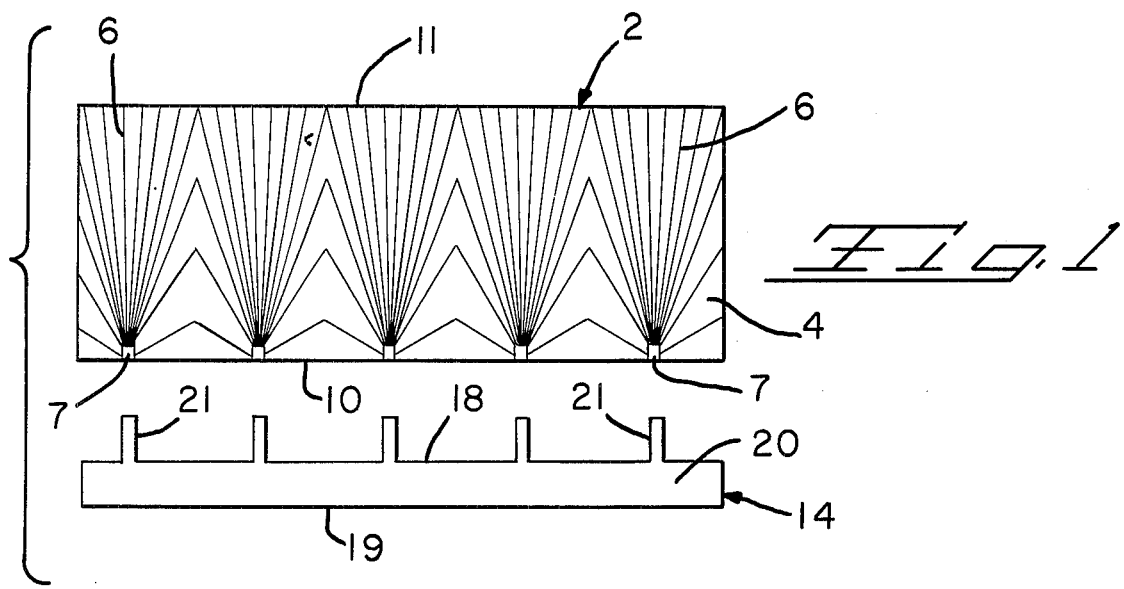
Fig. 1
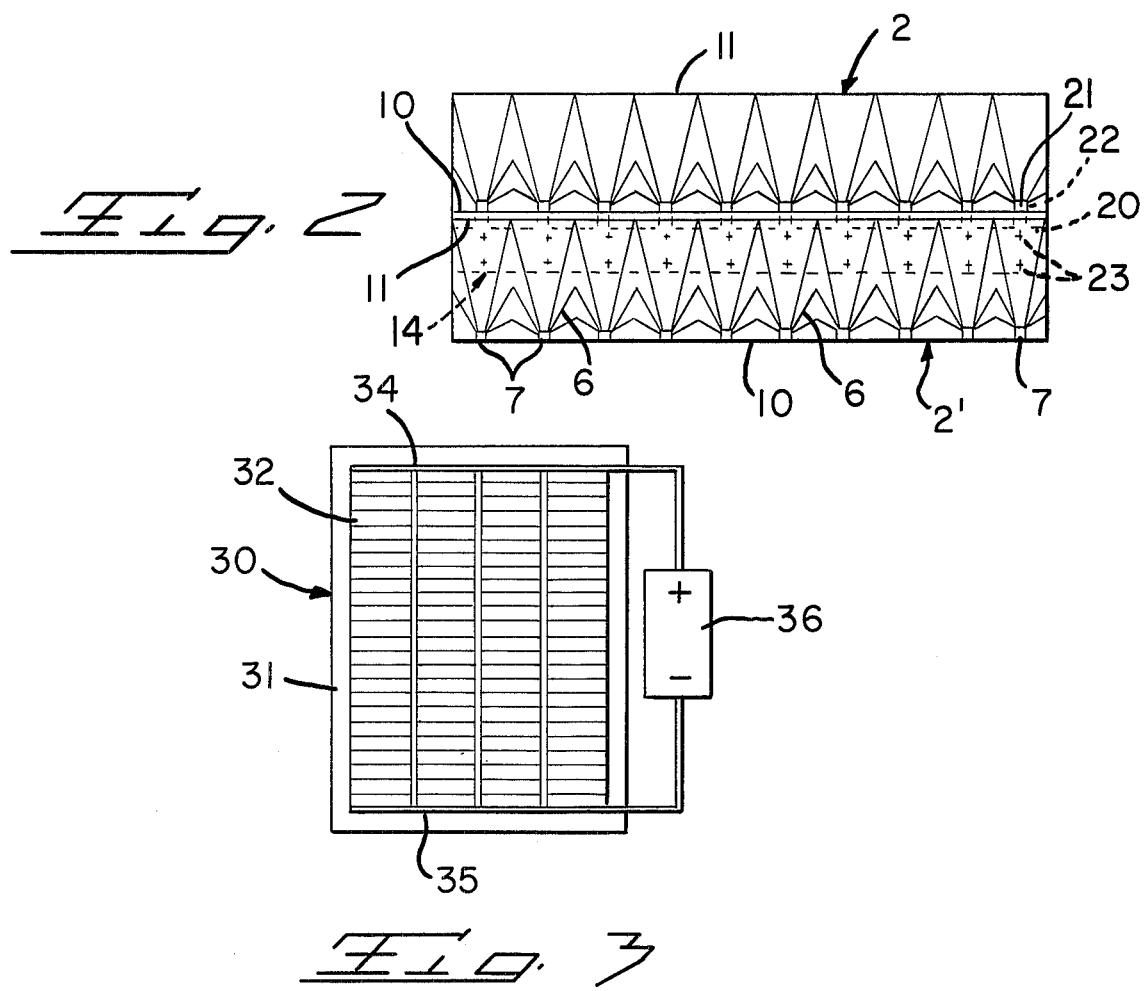
Fig. 2
Fig. 3

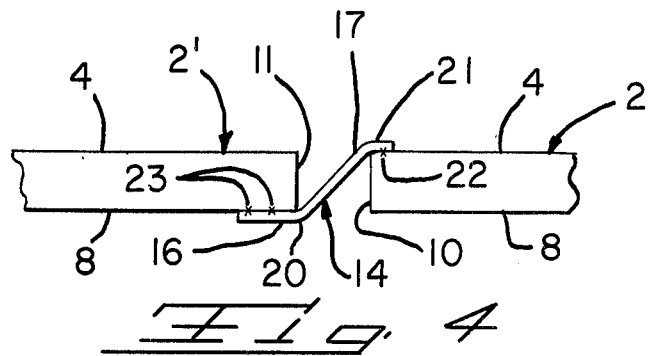
Fig. 4
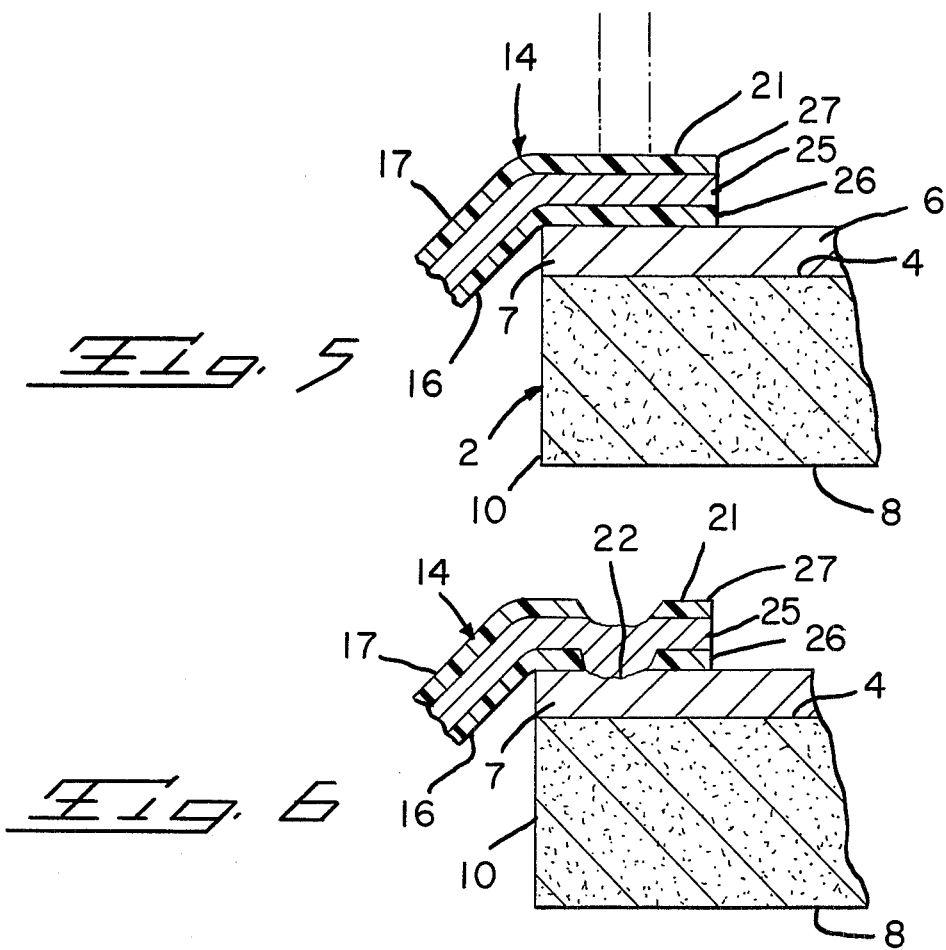
Fig. 5
Fig. 6

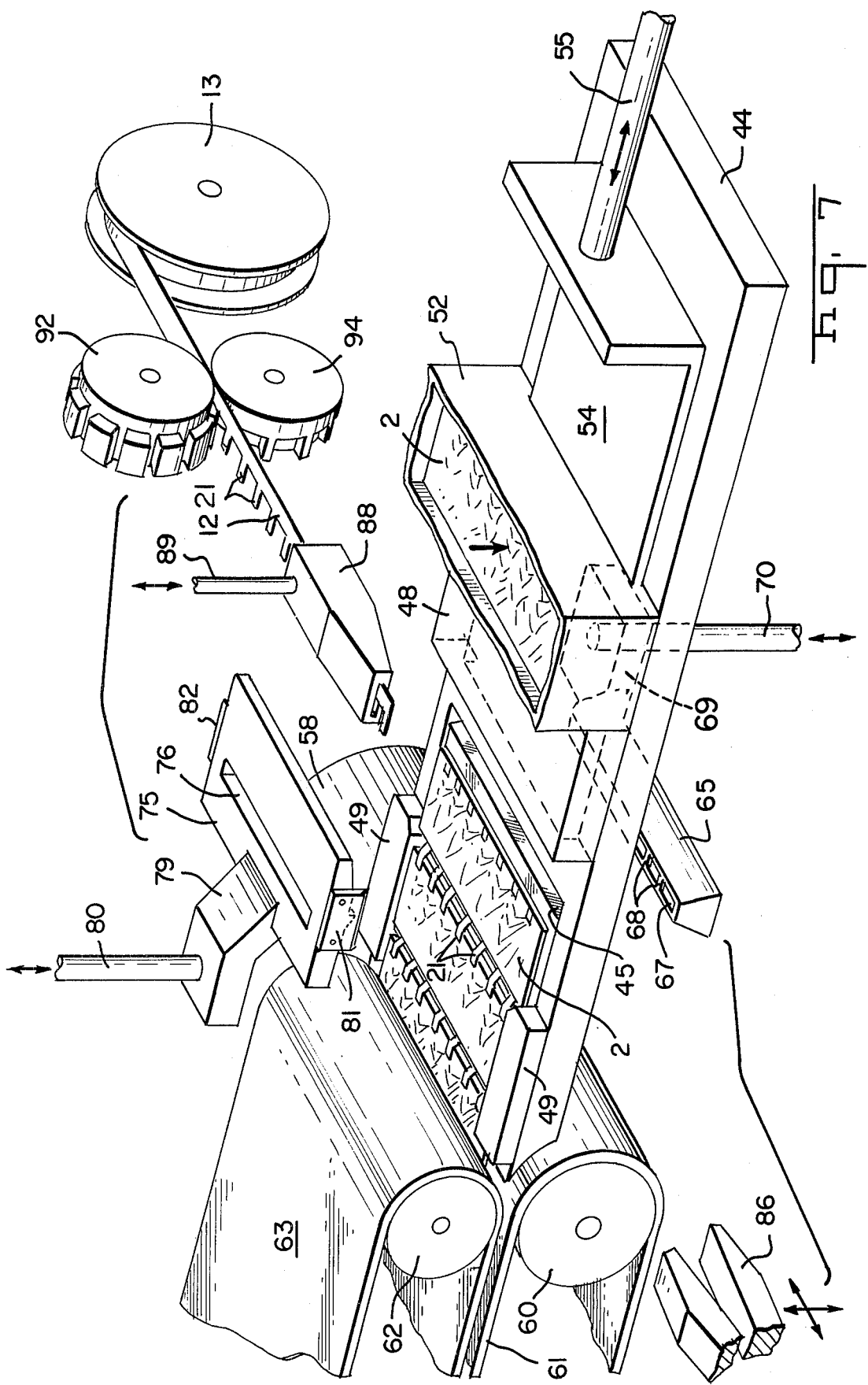

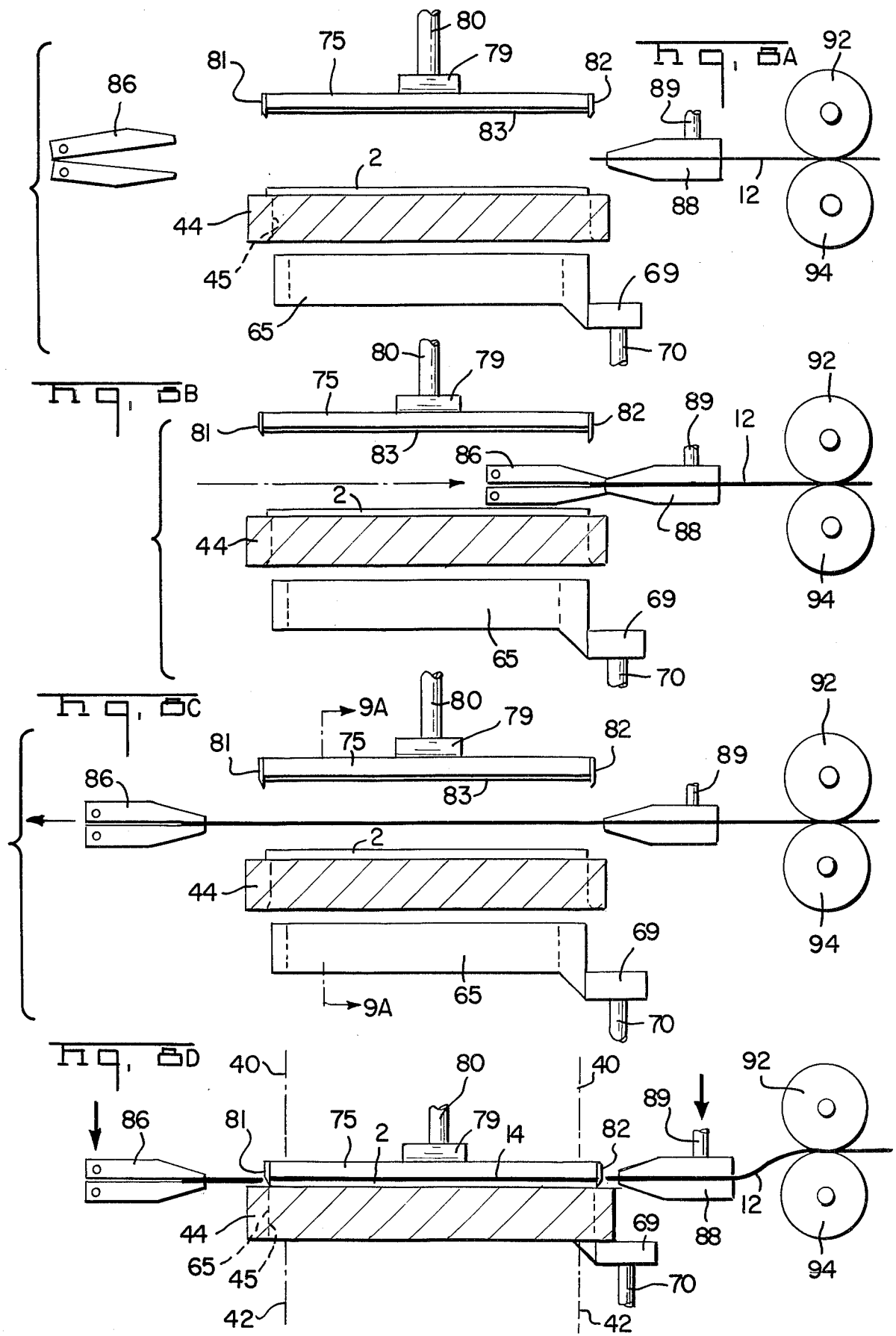

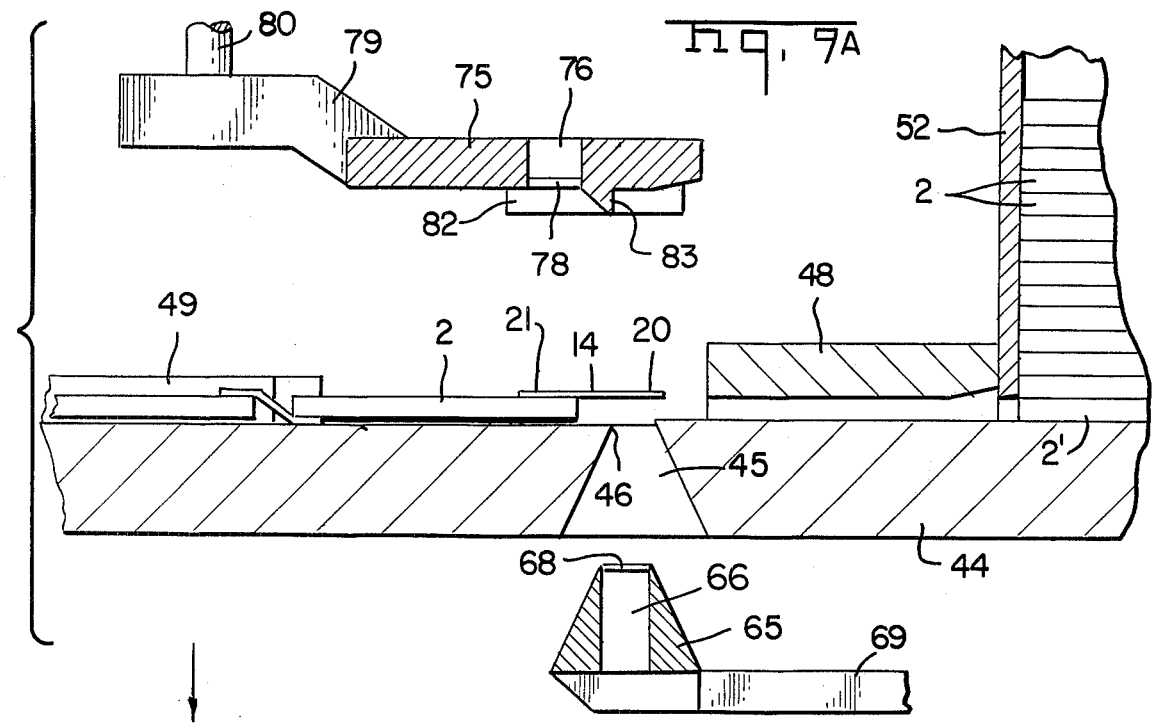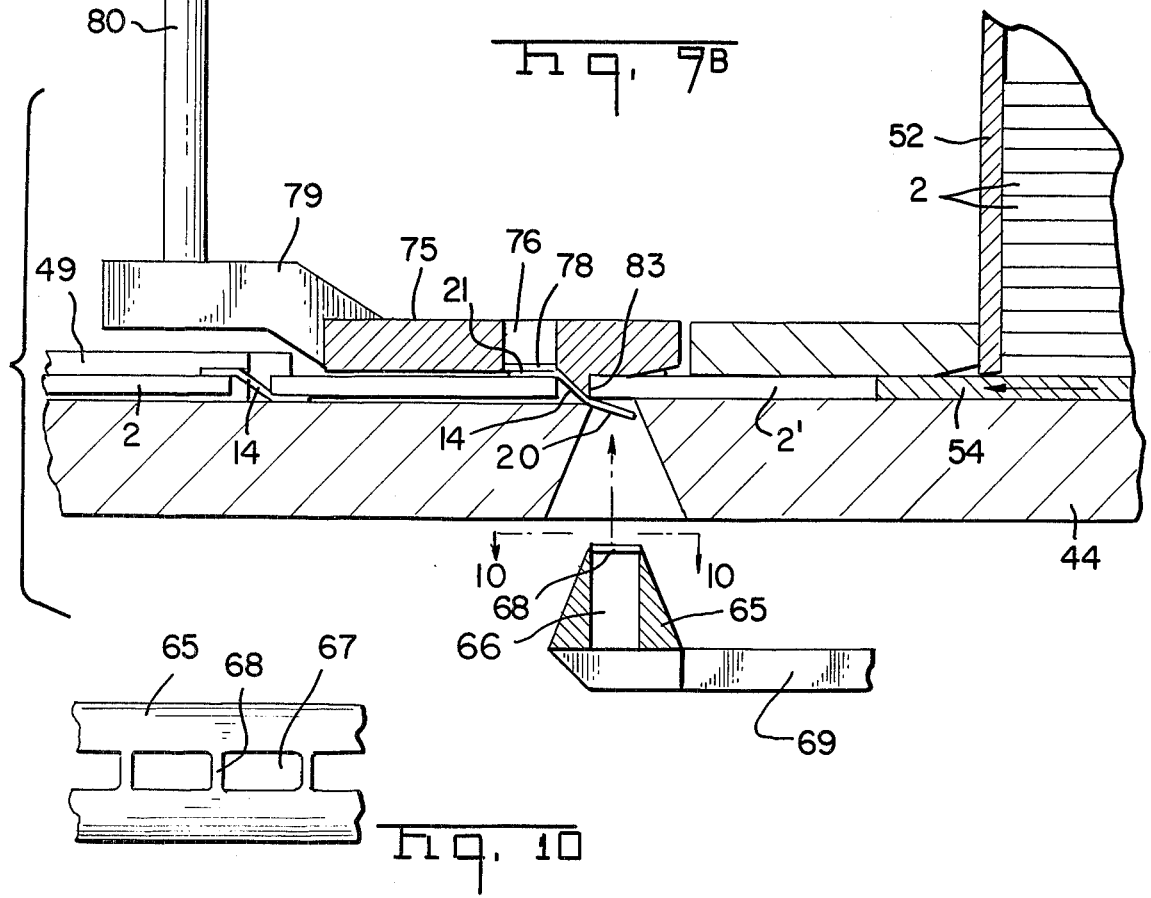

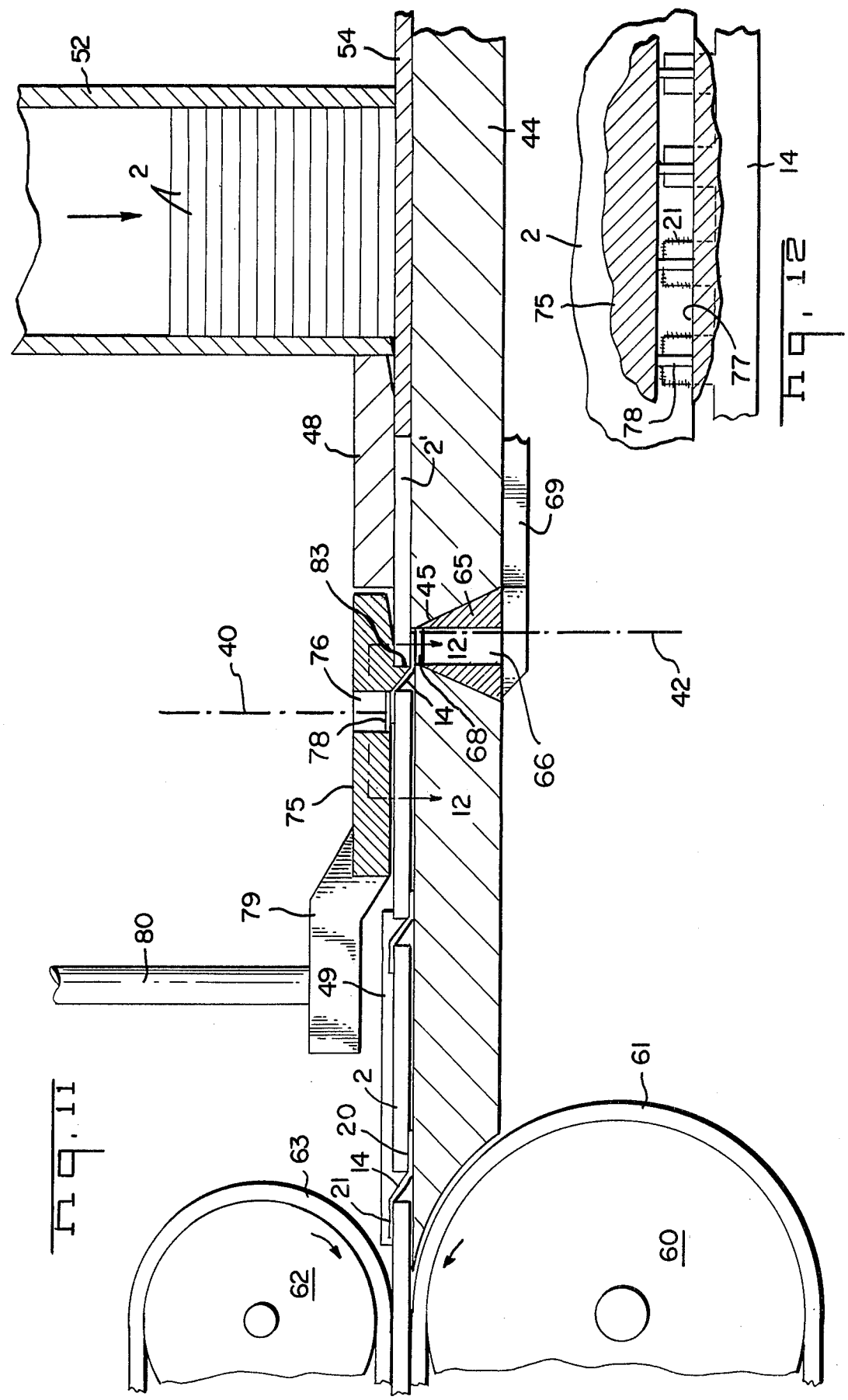

ELECTRON BEAM WELDED PHOTOVOLTAIC CELL INTERCONNECTIONS

BACKGROUND OF THE INVENTION

The present invention relates to an interconnecting system for photovoltaic cells in a power generating module.

Photovoltaic cells are silicon-base crystal wafers which produce a voltage between opposite surfaces when light strikes one of the surfaces, which surface has a current collecting grid thereon. Cells are interconnected into series strips by electrically interconnecting a collector pad on the grid to the opposite surface of the adjacent cell in the strip. Thus a desired voltage may be generated by series interconnecting a predetermined number of cells into a string, and a desired current may be produced by parallel interconnecting the assembled strings. The strings are assembled on a dielectric surface to form a module to facilitate handling and assembly into an array of modules for generating useful amounts of electrical power.

Rectangular wafers are presently undergoing considerable development due to their optimal usage of module area by eliminating the voids between cells of circular and semicircular shape. Further, rectangular cells are more easily manufactured than other shapes since they may be formed by laser cutting a single crystal ribbon. The elongate rectangular cells thus formed are provided with a plurality of side-by-side current collector grids on one surface thereof, and the grids each have a collector pad adjacent one edge of the cell. These are electrically connected to the opposite surface of the adjacent cell in the string by individual leads which are soldered or, more recently, ultrasonically bonded. Soldering of individual connecting leads in the form of wire or foil strips is quite time consuming, which thus adds to the cost of a module. Ultrasonic bonding of foil is more readily adapted to automation, but precludes the possibility of using an insulated connecting lead which would prevent shorting of the lead against the edge of a cell.

SUMMARY OF THE INVENTION

The solar cell interconnect system of the present invention utilizes a strip of metal foil having a bus section with tabs extending from one edge thereof. The spacing of the tabs is uniform and corresponds with the spacing of the collector pads on the surface adjacent the edge of a photovoltaic cell. One surface of the tabs is electrically connected to respective pads while the opposite surface of the strip is electrically connected to the adjacent cell on the surface opposite the grid. The strip is preferably a thin (0.001 inch) copper foil with an insulating laminate on both sides thereof. Electrical connection between adjacent cells is achieved by electron beam welding, which provides temperatures high enough to disintegrate the insulation while locally melting the foil to form the welds. The foil is fed from a reel in an automated procedure for interconnecting adjacent cells to form the series strings on a panel.

It is an object of the present invention to provide a cell-to-cell interconnect system for rectangular photovoltaic cells which lends itself to a relatively low cost automated connecting process.

It is a further object to provide insulated interconnect means for adjacent photovoltaic cells to prevent short-circuiting.

It is another object to provide interconnect means with uniform spacing between individual connection points.

The achievement of these and other objects will be apparent upon examining the drawings and description which follow.

BRIEF DESCRIPTION OF THE DRAWINGS

FIG. 1 is a plan view of half a solar cell and interconnecting strip.

FIG. 2 is a plan view of two connected solar cells.

FIG. 3 is a plan view of a finished solar panel.

FIG. 4 is an end view of two connected cells.

FIG. 5 is an enlarged sectional view of the tab on a connector strip against the pad on a collector grid prior to welding.

FIG. 6 is an enlarged sectional view of the tab on a connector strip against the pad on a collector strip after welding.

FIG. 7 is a perspective of the automated interconnect apparatus.

FIG. 8A is a diagrammatic end view prior to connector strip feed.

FIG. 8B shows the clamp as it advances to clamp the connector strip.

FIG. 8C shows the clamp as it returns to position the strip over the feed platform.

FIG. 8D shows the strip positioned between the upper and lower hold down plates.

FIG. 9A is a side view taken along line 9A—9A of FIG. 8C.

FIG. 9B is a side view showing the upper hold down plate in position as the pusher places the solar cell.

FIG. 10 is a partial plan view of the bottom hold down plate taken along line 10—10 of FIG. 9B.

FIG. 11 is a side sectional view of the apparatus as the interconnect strip is welded.

FIG. 12 is a cut away plan taken along line 12—12 of FIG. 11 showing the strip with several tabs welded to the solar cell.

DETAILED DESCRIPTION OF THE PREFERRED EMBODIMENT

FIG. 1 depicts half of a typical 10 cm by 2 cm rectangular photovoltaic cell at two times actual size. Each cell has a total of ten current collecting grids 6 on the first surface 4 thereof; each grid 6 comprises a fan-shaped array of fine conductors which radiate from a current collector pad 7 adjacent a first edge 10 of the cell 2 toward a second edge 11. A connector strip 14 is used to connect each cell 2 to an adjacent cell; each strip 14 has bus portion 20 bounded by first and second edges 18 and 19 respectively and a plurality of tabs 21 extending from first edge 18. The tabs 21 are uniformly spaced at the same spacing as the pads 7 to which they are to be connected.

FIG. 2 shows two photovoltaic cells 2 as interconnected by a connector strip 14, wherein the first edge 10 of one cell is aligned with a second edge 11 of an adjacent cell 2' and the tabs 21 are connected to the pads 7 at first contact points 22. The connector strips 14 are bent lengthwise to a "Z" configuration (FIG. 4) and the bus portion 20 is connected to the adjacent cell 2' at second contact points 23 (denoted +) on the surface opposite first surface 4. The cell 2' is then connected to the next adjacent cell to form a series connected string of cells.

FIG. 3 depicts four series strings 32 mounted on a dielectric base 31 to form a typical module 30. The cells are connected in series strings of forty-eight cells each (twenty-four are shown here for simplicity) and four strings are connected in parallel by buses 34, 35 to form a module of 192 cells developing a peak power output of 65 watts per module. Each cell develops a peak current of 0.76 amps and a voltage of 0.45 volts; each module 30 has a voltage output of 22 volts. The modules are generally connected in parallel and are used to charge a bank of batteries; for simplicity, only one module 30 and one battery 36 are shown.

FIG. 4 is an end view of the connection between the two cells, 2, 2'. Each cell is about 0.006 inches (0.15 mm) thick and has a first surface 4 and a second or opposed surface 8. The first edge 10 of cell 2 is about 1 mm (0.04 inch) from the second edge 11 of cell 2'. The foil connector strip 14 has a first surface 16 and a second surface 17. The tabs 21 are connected to cell 2 at contact point 22 and the bus 20 is connected to cell 2' at contact points 23.

FIG. 5 is a detailed view of the tabs 21 and the part of cell 2 proximate first end 10 prior to making electrical connection. The connector strip 14 comprises a piece 25 of copper foil 0.001 inch thick which is laminated on opposed surfaces with phenolic resin, about 0.001 inch thick on each surface. The resin coatings are denoted as first and second lamina 26, 27 and form the first and second surfaces 16, 17 respectively of the connector strip 14. The cell 2 has the collector pad 7 bonded to first surface 4, and the first lamina 26 is placed against the collector pad prior to making electrical connection. Each tab 21 is likewise placed against a pad 7, as the tabs 21 and pads 7 share the same uniform spacing along the edge 10 of cell 2.

FIG. 6 is a detailed view of the tab 21 and collector pad 7 after first contact point 22 has been formed. The contact point 22 is formed by electron beam welding; the high energy of the beam is sufficient to disintegrate the lamina 26, 27 and melt the copper foil 25 to form a weld between the foil 25 and the pad 7. The welding apparatus is programmed to direct the beam to successive tabs 21 until all tabs of a strip 14 are welded to the pads 7 on a grid. The second surface 17 of the strip 14 is likewise welded to the second surface 8 of the adjacent cell 2' by directing the electron beam against the bus portion 20 to disintegrate the second lamina 17 (FIGS. 4, 5 and 6) and form second contact points 23.

FIG. 7 is a diagrammatic perspective of an apparatus for automating the manufacture of solar modules. Cells 2 are loaded in a magazine 52 mounted on a feed platform 44. A pusher member 54 is intermittently actuated by an air cylinder through shaft 55 to push a cell 2 from magazine 52 through guide tunnel 48. Connector strips 14 (not shown) are provided in the form of continuous strip 12 from reel 13; rotary shear dies 92, 94 (driven by a motor not shown) profile the strip with tabs 21. Strip 12 is drawn by clamp 86, which is timed with the dies 92, 94, through a drag mechanism 88 to position it over platform 44. Upper clamp 75 is fixed to air cylinder shaft 80 by bracket 79; the clamp 75 moves vertically to clamp a portion of strip 12 against a cell 2. Shear blades 81, 82 on opposite ends of clamp 75 simultaneously shear a portion of continuous strip 12. An upper electron beam welder is programmed to weld tabs 21 to pads 7 on a cell 2 by projecting an electron beam through aperture 76. Lower clamp 65 is fixed to air cylinder shaft 70 by bracket 69 and moves into aperture 45 to clamp a portion of the strip 12 against a cell 2. A lower electron beam welder is programmed to weld the bus portion 20 to the second surface 8 (FIG. 4) of the next cell 2 by projecting an electron beam through apertures 67. Electron beam welders are not shown but are well known. These are situated about 0.5 inch from the platform 44, the short distance being desirable so that the welding operation can be performed in a low vacuum environment. Note that for purposes of clarity the lower clamp 65 and upper clamp 75 are shown considerably further from the platform 44 than in the actual apparatus. The vertical movement of clamps 65, 75 is actually only as much as necessary to clamp strip 14, and thus does not interfere with the close spacing of the electron beam welders. After welding, interconnected cells are then drawn through lateral guides 49 and off of platform 44 between lower belt 61 and upper belt 63. The belts 61, 63 are carried by rollers 60, 62 resectively, which are driven intermittently by stepping motor 58. Finished strings of cells are removed from the belts 61, 63 at the downstream end thereof.

FIGS. 8A through 8D depict the sequence of operations in feeding strip 12. FIG. 8A corresponds to FIG. 7 and shows the clamps 65, 75 in the open position. The clamp 86 and drag mechanism 88 are shown elevated slightly above platform 44 to facilitate illustration. In actuality, these would be located forward of the clamps 65, 75 and moved laterally to place the strip 12 prior to shearing. FIG. 8B shows the clamp 86 as it advances to abut drag mechanism 88 and clamp the leading end of strip 12; FIG. 8C shows the clamp 86 as it retreats to position a portion of strip 12 over cell 2. In FIG. 8D, the clamp 86 and drag mechanism 88 have moved down to place a portion of the strip 12 against cell 2 and the upper clamp 75 has moved down to shear connector 14 from continuous strip 12 and clamp the strip 14 against cell 2. The lower clamp 65 is shown in aperture 45 of the feed platform 44.

FIGS. 9A and 9B detail the operation of clamps 65, 75 and the advance of cells 2. FIG. 9A shows the strip 14 positioned with tabs 21 against cell 2. FIG. 9B shows the upper clamp 75 as it moves down to clamp the tabs 21 against cell 2. The stop 83 serves to deflect the bus portion 20 into aperture 45 and immediately thereafter the pusher 54 advances the next cell 2' until it abuts stop 83 as shown. FIG. 10 is a partial plan view of the clamp 65 showing windows 67 therethrough which are separated by dividers 68. Clamp 75 likewise has windows 77 separated by dividers 78 (FIGS. 11 and 12).

FIG. 11 is the next step in sequence after FIG. 9B and shows the bottom clamp 65 advanced upwardly into aperture 45 to clamp the bus portion 20 of strip 14 against the next advanced cell 2'. At this time the electron beam welders project electron beams 40, 42 which fuse the strip 14 to cells 2, 2'. FIG. 12 depicts the tabs 21 after welding to a cell 2; the welder is programmed so that the beam follows the outline of each tab 21. The bus portion 20 is spot welded at several points adjacent to each tab 21 by electron beam 42. The dividers 68 (FIGS. 9 and 10) and 78 are extremely low in profile so as not to interfere with the electron beams; clamping arrangements without dividers are also possible. Note that only low vacuum is required for the instant welding operation since the energies required to melt the 0.001 in foil are are quite low, and dispersion in the air of a partial vacuum is thus not a significant hindrance.

I claim:

1. A photovoltaic generating module of the type comprising a plurality of elongate photovoltaic cells, each said cell having a light-receiving first surface and an opposed second surface, said surfaces being bounded by parallel opposed elongate first and second edges, said first edge of at least one cell being proximate to the second edge of an adjacent cell, said first surface having a plurality of current collection grids thereon, each grid having a collector pad adjacent said first edge, said pads having a uniform spacing, said at least one cell having electrical connecting means between said collector pads and the second surface of said adjacent cell, characterized in that said interconnecting means comprises a strip of metal foil having opposed first and second surfaces and parallel opposed first and second edges, said first and second surfaces being fully insulated by respective first and second laminas of dielectric material, said strip having tabs extending normally of said first edge, said tabs having a like uniform spacing, said first surface of each said tab having a contact point which is electron beam welded to a respective said collector pad of said at least one cell, said second surface of said strip having a contact point proximate to each said tab which is electron beam welded to said second surface of said adjacent, said contact points being formed by disintegrating said laminas during welding.

2. A method for interconnecting individual elongate photovoltaic cells into a series string, each said cell having a light-receiving first surface and an opposed second surface, said surfaces being bounded by parallel opposed elongate first and second edges, said first surface having a plurality of current collection grids, each grid having a collector pad adjacent said first edge, said pads having a uniform spacing, said cell being connected to an adjacent cell by a strip of foil having opposed first and second surfaces which are fully insulated by respective first and second laminas of dielectric material and parallel opposed first and second edges, said strip having tabs at a like uniform spacing extending normally of said first edge, said method comprising the steps of:

advancing said strip from a substantially endless source and aligning a portion adjacent one of said cells such that said first surface of said tabs are aligned against respective adjacent collector pads, shearing said portion of said strip from said endless source, electron beam welding said tabs to said collector pads, wherein electrical contact between said tabs and said pads is achieved by disintegration of said laminas in the vicinity of said contact during said welding, advancing the second edge of another cell toward the first edge of said one cell such that said second surface of said portion of strip is aligned against said second surface of said another cell, electron beam welding said second surface of said strip to said second surface of said another cell at at least one point proximate to each of said tabs, advancing said one cell at right angles to said strip until said another cell is located where said one cell was previously located.

* * * * *